United States Patent [19]

Veendrick et al.

[11] Patent Number: 4,820,936

[45] Date of Patent: Apr. 11, 1989

[54] INTEGRATED CMOS CIRCUIT COMPRISING A SUBSTRATE BIAS VOLTAGE GENERATOR

[75] Inventors: Hendrikus J. M. Veendrick; Cornelis G. L. M. Van Der Sanden; Arie Slob, all of Eindhoven, Netherlands

[73] Assignee: U.S. Philips Corp., New York, N.Y.

[21] Appl. No.: 94,363

[22] Filed: Sep. 8, 1987

[30] Foreign Application Priority Data

May 29, 1987 [NL] Netherlands .......................... 8701278

[51] Int. Cl.[4] ...................... H03K 17/16; H03K 17/14; H03K 17/06; H01L 27/02
[52] U.S. Cl. ................................. 307/296.2; 307/592
[58] Field of Search .................. 307/296.2, 296.8, 304, 307/592, 475

[56] References Cited

U.S. PATENT DOCUMENTS

| | | | |
|---|---|---|---|
| 4,377,756 | 3/1983 | Yoshihara et al. | 307/296.2 |
| 4,378,506 | 3/1983 | Taira | 307/296.2 |
| 4,439,692 | 3/1984 | Beekmans et al. | 307/296.2 |
| 4,503,339 | 3/1985 | Tsuge et al. | 307/296.2 |

FOREIGN PATENT DOCUMENTS

| | | | |
|---|---|---|---|
| 0022870 | 1/1981 | European Pat. Off. | 307/296.2 |
| 0029681 | 6/1981 | European Pat. Off. | 307/296.2 |
| 0085253 | 5/1982 | Japan | 307/296.2 |
| 0193056 | 11/1984 | Japan | 307/296.2 |

OTHER PUBLICATIONS

Cassidy et al., "Substrate Voltage Regulator", IBM Tech. Discl. Bull., vol. 27, No. 2, pp. 1137-1138, Jul. 1984.

*Primary Examiner*—Stanley D. Miller
*Assistant Examiner*—David R. Bertelson
*Attorney, Agent, or Firm*—Steven R. Biren

[57] ABSTRACT

In CMOS integrated circuits, "latch-up" problems may arise if no special steps are taken. One way to counteract a "latch-up" state is to apply a substrate bias voltage. In an integrated circuit, an externally-clocked substrate bias voltage pump and a stand-by bias voltage generator are provided, the latter not being switched on until the substrate bias voltage becomes less negative than, for example, $-2V$. As a result, the integrated circuit becomes less sensitive to "latch-up", especially during measuring and testing procedures, in which no external clock signal is supplied.

5 Claims, 1 Drawing Sheet

U.S. Patent   Apr. 11, 1989   4,820,936
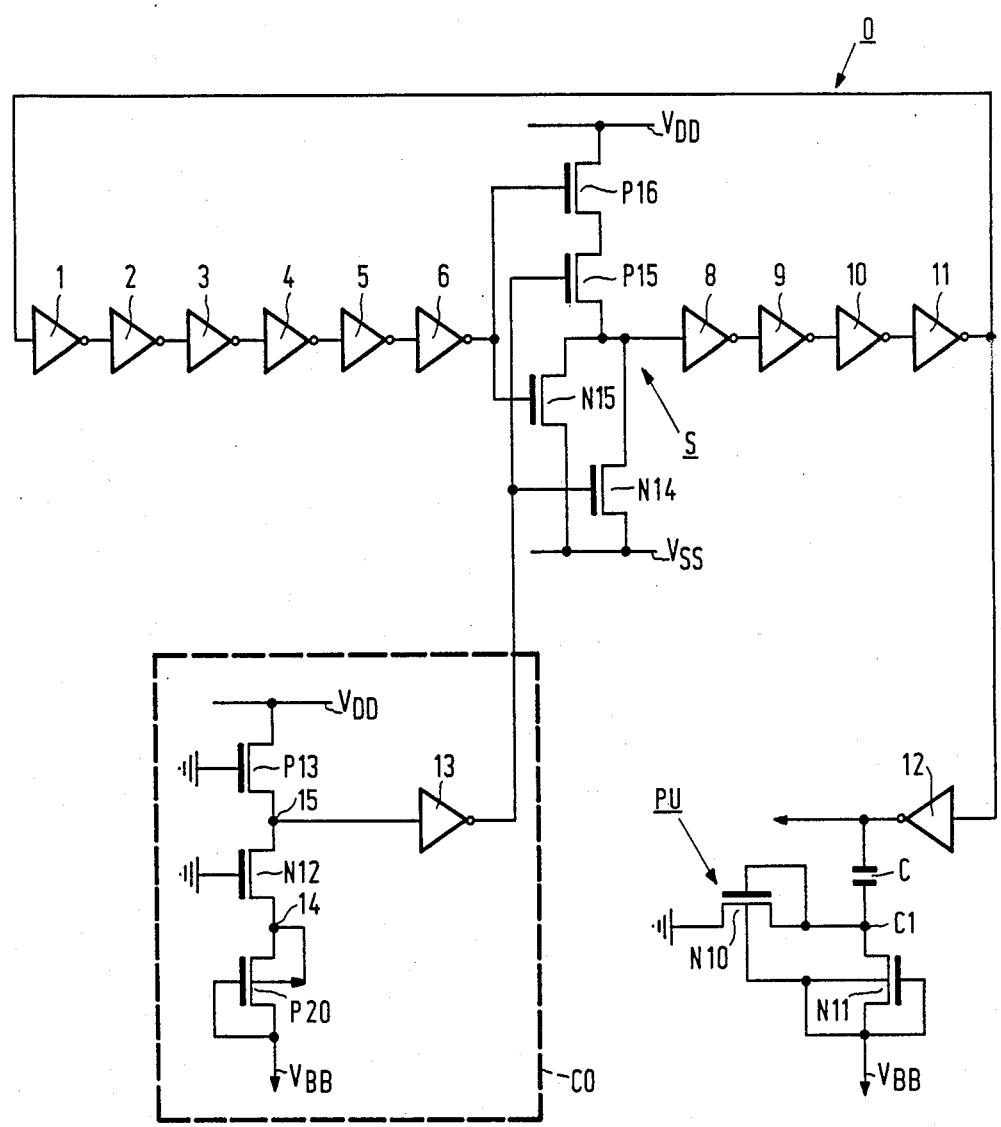

INTEGRATED CMOS CIRCUIT COMPRISING A SUBSTRATE BIAS VOLTAGE GENERATOR

BACKGROUND OF THE INVENTION

The invention relates to an integrated CMOS circuit comprising a substrate bias voltage generator, which is driven by a clock generator, which also controls further circuits in the integrated circuit.

An integrated CMOS circuit, in which a substrate bias voltage generator is included, is known from European Patent No. 0029681 published on Jan. 28th 1987. Substrate bias voltage generators are used in CMOS circuits in order to avoid the so-called "latch-up" state. If no substrate bias voltage generators are used, this "latch-up" state is very liable to be attained. In a CMOS process with n wells used frequently, both n- and p-type transistors are implemented, as a result of which parasitic thyristors are also formed. If one or more of these thyristors are ignited at junction points in a circuit and at different areas in a substrate, said junction points of the circuit are held at a fixed voltage by these thyristors. This results in that the circuit no longer operates correctly and has passed into a "latch" state. When a substrate bias voltage is produced, it is ensured that it is much more difficult for the thyristors to ignite. In general, a substrate bias voltage generator consists of a capacitive pump controlled by a ring oscillator. The ring oscillator is also used for producing the clock frequency, which is utilized to control the further circuits in the integrated circuits. However, the "latch-up" sensitivity now depends upon the clock frequency because, if a higher clock frequency is used, the pump of the substrate bias voltage generator must also operate more rapidly in order to be able to compensate for the substrate currents increased by the higher clock frequency.

In European Patent Application EP-A-No. 0022870, a semiconductor circuit including first and second bias voltage generators is shown. This circuit generates both fixed and variable substrate bias voltages, but does not include switchable circuitry to activate or deactivate the bias voltage generating circuitry on demand.

Many integrated CMOS circuits, however, have an input terminal for supplying a clock signal having a frquency desired by the user of the circuit because the circuit must fit into a system designed by the user or because the circuit can operate in different modes, in which event different clock frequencies are required for the different modes. An example thereof is a memory circuit serving to store teletext information in television applications. The clock frequency for the memory is then also determined by the 625 or 525 image line system used in television applications. An oscillator for controlling the charge pump of the substrate bias voltage generator is not integrated in such integrated circuits. The charge pump is then controlled by the clock pulses which are externally applied to the circuit. However, when the integrated circuit is tested by the user, a clock frequency is not always supplied. If in this case tests are carried out, no substrate bias voltage is produced. as a result of which an increased "latch-up" sensitivity is obtained. Further, when the circuit is developed, nevertheless one or several parts of the circuit may unexpectedly pass into the "latch-up" state during measuring procedures on the first manufactured silicon wafers with the CMOS circuit, as a result of which substrate currents will flow, which cause the substrate bias voltage to decrease. This results in that even larger parts of the integrated circuit pass into the "latch-up" state, etc. Ultimately, no measurements can be carried out on the integrated circuit.

SUMMARY OF THE INVENTION

The invention has for its object to provide an integrated CMOS circuit, in which measures are taken, due to which, even in the absence of the clock frequency, when the circuit is tested by the user or when measurements are carried out on the circuit during the development of the product, a "latch-up" state cannot occur.

The integrated CMOS circuit according to the invention is therefore characterized in that the integrated circuit includes a further substrate bias voltage pump, which is driven by an integrated oscillator, which can be switched on by switching means, which are driven by the output of a comparator circuit for comparing the substrate bias voltage with a reference voltage. An integrated CMOS circuit comprising such an oscillator and such a substrate bias voltage pump has the advantage that, if the substrate bias voltage is not more negative than a voltage to be adjusted, for example $-2.2$ V, this bias voltage generator is automatically switched on. As a result, additional substrate currents can be compensated during normal operation, but the substrate bias voltage generator may also operate for hundred per cent of the time, if during testing by the user or during measurement of the integrated circuit no clock pulses are supplied during its development.

BRIEF DESCRIPTION OF THE DRAWINGS

The integrated circuit according to the invention will be described with reference to an example shown in a the single FIGURE of the drawing, which shows a substrate bias voltage generator.

DESCRIPTION OF THE PREFERRED EMBODIMENT

In an integrated CMOS circuit according to the invention, an oscillator O is used, which can be switched on and off by switching means S, while a comparator circuit CO is provided for comparing the substrate bias voltage $V_{BB}$ produced with a reference voltage and a charge pump PU for producing the substrate bias voltage $V_{BB}$, which pump PU is controlled by the output of the oscillator O. The oscillator O comprises a number of series-connected amplifier circuits 1 to 6 and 8 to 11, an amplifier that can be switched on and off by the switching means S being connected between the amplifier circuits 6 and 8. The switching means S with amplifier circuit used here constitute a NOR gate comprising two series-connected PMOS transistors and two parallel-connected NMOS transistors. The P-transistor P15 and the N-transistor N15 of the NOR gate become the amplifier circuit forming part of the ring oscillator O, which comprises the inverters 1 to 11. The transistors P16 and N14 of the NOR gate constitute the switching means S, by which the ring oscillator O is switched on or off by coupling the input of amplifier circuit 8 to either $V_{DD}$ (supply voltage) or $V_{SS}$ (reference voltage, typically ground). The output of the inverter 11 is connected to the input of a driver stage 12, which controls the substrate bias voltage pump PU. Substrate bias voltage pumps PU are known per se and need not be described further. The comparator circuit CO comprises a voltage divider connected between the supply voltage $V_{DD}$ and the substrate voltage $V_{BB}$. The voltage divider comprises three transistors connected in series, while, starting from $V_{DD}$, a PMOS transistor P13, whose gate electrode is connected to ground, an NMOS transistor, whose gate electrode is also connected to ground, and a second PMOS transistor, whose gate electrode is connected to the substrate bias voltage $V_{BB}$, are successively connected in series. A junction point 15 between the drains of the PMOS transistor P13 and the NMOS transistor N12 is connected to an input of the inverter 13, whose output controls the switching means S or the transistors P15 and N14. The operation of the comparator circuit is as follows. The transistors P13 and P20 are always conducting and form with the NMOS transistor N12 a voltage divider if this transistor N12 is also conducting. The dimensions of these three transistors P13, N12 and P20 are chosen so that the input voltage of the inverter 13 is always sufficiently low at a sufficiently low substrate voltage to cause the output to be high. This results in that the transistor P15 is cut off and the transistor N14 of the switching means S is conducting. Therefore, the oscillator O is switched off. If now the substrate bias voltage $V_{BB}$ is no longer sufficiently negative, in other words becomes more positive, the NMOS transistor N12 will be cut off because its gate electrode is connected to ground. The voltage between the gate electrode and the main electrode at the junction point 14 between the NMOS transistor 12 and the PMOS transistor 20 is then no longer higher than the threshold voltage of the NMOS transistor N12. The NMOS transistor N12 will thus be cut off and the junction point 15 is charged via the conducting PMOS transistor P13. Therefore, if the voltage at the junction point 15 exceeds the threshold voltage of the inverter 13, the output of this inverter 13 will change over from high to low. Therefore, the PMOS transistor P15 of the switch S becomes conducting and the NMOS transistor N14 of the switch S is cut off. The oscillator O is thus switched on. Therefore, via the driver 12 and the charge pump PU, charge is pumped to the substrate so that the substrate threshold voltage $V_{BB}$ becomes more negative. The oscillator O continues to operate until a sufficiently negative substrate bias voltage $V_{BB}$ is produced. During the decrease of the substrate bias voltage, the voltage at the junction point 14 between the transistors N12 and P20 also further decreases so that the gate-source voltage of the transistor N12 will increase. If now a sufficiently negative substrate bias voltage $V_{BB}$ is reached, the transistor N12 will again become current conducting so that the junction point 15 is discharged. The input of the inverter 13 is discharged from a high potential to a low potential so that the output of the inverter 13 obtains a high output level and consequently switches off the oscillator O via the switching means S comprising the transistors P15 and N14.

The known charge pump PU has a capacitance C connected between the inverter 12 and a junction point C1 and two NMOS transistor N10 and N11, which are connected between the junction point C1 and ground and the substrate, respectively. The two transistors N10 and N11 are used in known manner as diodes. The pump capacitance C of, for example, 10 pF is charged via the NMOS transistor N10 (the output of the inverter 12 is high) and is discharged via the transistor N11 to the substrate. During the discharge, however, the transistor N11 will behave like a bipolar transistor because the source of the transistor N11 becomes more negative than the substrate (at $V_{BB}$), which then acts as a base. However, the transistor N10 behaves in the same manner so that the transistor N10 is switched off as MOS field effect transistor, it is true, but is current-conducting as a bipolar element. If the transistors N10 and N11 are of the same size, half of the charge stored in the capacitance C will be drained by the transistor N10. The charge pump PU has an efficiency of only 50%. If now the transistor N11 is made larger than the transistor N10 (for example width/length of N11 = five times width/length of the transistor N10), the efficiency can be improved (in the example up to ±80%).

What is claimed is:

1. An integrated CMOS circuit comprising a first substrate bias voltage generator, which can be driven by an external clock generator, which also controls further circuits in the integrated circuit, and a second substrate bias voltage generator, characterized in that said second substrate bias voltage generator comprises a substrate bias voltage pump for generating a substrate bias voltage, an integrated oscillator for driving said substrate bias voltage pump, switching means for switching said oscillator on and off, and a comparator circuit for comparing the substrate bias voltage with a reference voltage and providing an output to drive said switching means.

2. An integrated CMOS circuit as claimed in claim 1, characterized in that the integrated oscillator is a ring oscillator comprising a plurality of series-connected inverter stages, an inverter stage together with the switching means comprising a NOR gate.

3. An integrated CMOS circuit as claimed in claim 1 or 2, characterized in that the comparator circuit comprises an inverter and a series-connected combination of a PMOS transistor, an NMOS transistor and a second PMOS transistor connected as a diode coupled between the positive supply voltage and the substrate voltage, the first-mentioned PMOS and the NMOS transistor being connected by their gate electrodes to ground, a junction point of their drains being connected to the input of the inverter and the diode-connected second PMOS transistor being connected between the NMOS transistor and the substrate voltage.

4. An integrated CMOS circuit comprising a substrate and a substrate bias voltage generator, which includes a first junction point and an oscillator having an output, a capacitance coupled between said first junction point and said output, a first NMOS transistor connected as a diode between the first junction point and ground and a second NMOS transistor connected as a diode between the first junction point and the substrate, characterized in that the width/length ratio of the second transistor is substantially larger than the width/length ratio of the first transistor.

5. An integrated CMOS circuit as claimed in claim 4, characterized in that the width/length ratio of the second transistor exceeds that of the first transistor by a factor 5.

* * * * *